(12) United States Patent
Ravula Lakshmi et al.

(10) Patent No.: US 9,461,624 B2
(45) Date of Patent: Oct. 4, 2016

(54) OUTPUT DRIVER SLEW CONTROL

(71) Applicant: Infineon Technologies AG, Neubiberg (DE)

(72) Inventors: Soujanya Ravula Lakshmi, Bangalore (IN); Madesh Umashankar, Bangalore (IN)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/543,662

(22) Filed: Nov. 17, 2014

(65) Prior Publication Data

US 2016/0142043 A1    May 19, 2016

(51) Int. Cl.
*H03K 3/011* (2006.01)
*H03K 3/012* (2006.01)

(52) U.S. Cl.
CPC ............. *H03K 3/011* (2013.01); *H03K 3/012* (2013.01)

(58) Field of Classification Search
CPC .......... H02M 3/33507; H02M 3/158; H02M 3/156; H03K 3/012; H03K 17/04; H03K 17/56; H03K 17/08
USPC .................................. 327/108, 109, 110, 112
See application file for complete search history.

(56) References Cited

U.S. PATENT DOCUMENTS

| | | | |
|---|---|---|---|
| 4,987,324 A | 1/1991 | Wong et al. | |
| 5,619,147 A | 4/1997 | Hunley | |
| 5,623,216 A | 4/1997 | Penza et al. | |
| 5,877,647 A | 3/1999 | Vajapey et al. | |
| 6,031,389 A * | 2/2000 | Fotouhi ............ | H03K 19/00361 326/31 |
| 6,160,416 A | 12/2000 | Adduci et al. | |
| 6,492,686 B1 | 12/2002 | Pappert et al. | |
| 7,471,111 B2 | 12/2008 | Seth et al. | |
| 8,638,131 B2 | 1/2014 | Chen et al. | |
| 2006/0012406 A1 | 1/2006 | Huber et al. | |
| 2008/0246512 A1 | 10/2008 | Seth et al. | |
| 2009/0195270 A1 | 8/2009 | Lin | |
| 2012/0212260 A1 | 8/2012 | Chen et al. | |

FOREIGN PATENT DOCUMENTS

| | | |
|---|---|---|
| EP | 0199374 B1 | 8/1992 |
| EP | 0678983 B1 | 8/1998 |

OTHER PUBLICATIONS

Ker, M-D. et al., "Design on Mixed-Voltage I/O Buffers with Slew-Rate Control in Low-Voltage CMOS Process," 15th IEEE International Conference on Electronics, Circuits and Systems, Aug. 31-Sep. 3, 2008, pp. 1047-1050.

* cited by examiner

*Primary Examiner* — John Poos
(74) *Attorney, Agent, or Firm* — Shumaker & Sieffert, P.A.

(57) ABSTRACT

In one example, a method includes, in response to a voltage level of an input signal satisfying an input voltage threshold, activating a first driver of a plurality of drivers configured to collectively generate an output signal. In this example, the method also include, in response to the voltage level of the input signal satisfying the input voltage threshold and a voltage level of the output signal satisfying an output voltage threshold, toggling activation of a second driver of the plurality of drivers, wherein the second driver is configured to switch more current when activated than the first driver, and wherein the first driver has a faster slew rate than the second driver.

18 Claims, 5 Drawing Sheets

OUTPUT DRIVER SLEW CONTROL

TECHNICAL FIELD

This disclosure relates to output drivers, which may be used for data communication on a controller area network (CAN) bus or other applications.

BACKGROUND

Output drivers may be used in a wide variety of systems. As one example, electrical drivers may be used to communicate data over wired interfaces. When communicating data over a wired interface, signal integrity may be a problem. For instance, the electrical properties of the interconnections and/or packaging may interfere with the signaling voltages & currents and affect the performance of the output driver. In some examples, output driver slew rate control may be used to address such signal integrity issues.

For instance, with proper slew rate control of the output signal generated by an output driver, signal integrity issues resulting from switching noise (dI/dt), transmission line effects, and electromagnetic interference (EMI) (dV/dt) may be reduced.

SUMMARY

In general, this disclosure is directed to techniques for combining multiple drivers with different properties into an output driver. For example, a first driver with a desired slew rate may be combined with a second driver with desired DC characteristics to form an output driver that has both a desirable slew rate and desirable DC characteristics.

In one example, a method includes, in response to a voltage level of an input signal satisfying an input voltage threshold, activating a first driver of a plurality of drivers configured to collectively generate an output signal. In this example, the method also include, in response to the voltage level of the input signal satisfying the input voltage threshold and a voltage level of the output signal satisfying an output voltage threshold, toggling activation of a second driver of the plurality of drivers, wherein the second driver is configured to switch more current when activated than the first driver, and wherein the first driver has a faster slew rate than the second driver.

In another example, an output driver includes a plurality of drivers configured to collectively generate an output signal. In this example, a first driver of the plurality of drivers is configured to activate responsive to a voltage level of an input signal satisfying an input voltage threshold, and a second driver of the plurality of drivers is configured to toggle activation responsive to the voltage level of the input signal satisfying the input voltage threshold and a voltage level of the output signal satisfying an output voltage threshold. In this example, the second driver is configured to switch more current when activated than the first driver, and the first driver has a faster slew rate than the second driver.

In another example, an output driver includes a plurality of means for collectively generating an output signal, and means for controlling the means for collectively generating the output signal. In this example, the means for controlling may be configured to: activate a first means of the plurality of means for collectively generating the output signal responsive to a voltage level of an input signal satisfying an input voltage threshold, and toggle activation of a second means of the plurality of means for collectively generating the output signal responsive to the voltage level of the input signal satisfying the input voltage threshold and a voltage level of the output signal satisfying an output voltage threshold. In this example, the second means is configured to switch more current when activated than the first means, and the first means has a faster slew rate than the second means.

Details of these and other examples are set forth in the accompanying drawings and the description below. Other features, objects, and advantages will be apparent from the description and drawings, and from the claims.

DETAILED DESCRIPTION

Figure 1:
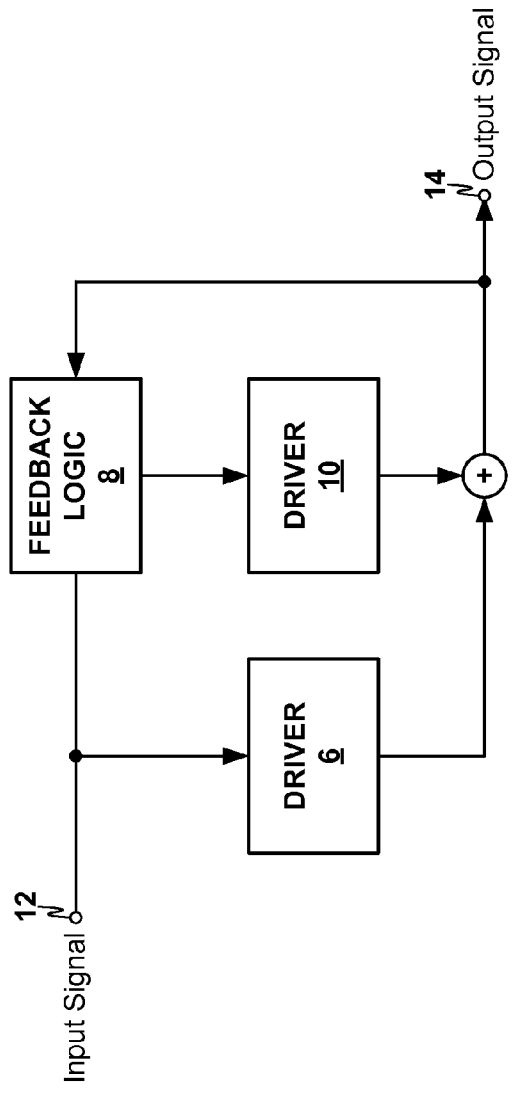
FIG. 1 is a conceptual diagram illustrating example output driver, in accordance with one or more techniques of this disclosure.

As discussed above, slew rate control may be used to reduce signal integrity issues of the output signal generated by an output driver. However, in some examples, it may not be desirable to design an output driver to have a reduced slew rate, e.g., due to the resulting impact on the other electrical characteristics of the output signal. As one example, an increase in the propagation delay of the output driver may occur when an output driver is turned on slowly. This is because the propagation delay is a cumulative delay of the internal signal delay from input to the gate of the driver and the rate at which the output signal rises/falls as driven by the driver.

Propagation delay may be defined at the time elapsed between a time where the input level of the driver crosses an input threshold (e.g., 50%) to a time where the output level of the driver crosses an output threshold (e.g., 50%). The input threshold and the output threshold may be selected based on e.g., a communication standard and/or application of the driver. As such, it is desirable for an output driver to satisfy one or more EMI requirements (e.g., through very slow slew rates of the output signal) without significantly increasing the propagation delay (e.g., minimizing the impact of the slow slew rates on the delay contribution from the output signal rise/fall).

As one example, the slew rate of an output driver may be controlled by adding a pre-resistance(poly) to the driver. For instance, where an output driver includes one or more metal-oxide semiconductor (MOS) transistors which may have huge variation over process, voltage and temperature (PVT), a resistance may be added to the path of the output driver. As the resistance has lower variation over PVT conditions, including the resistance in the path may help control the slew rate of the output signal (e.g., because adding a pre-resistance to a MOS transistor pushes the MOS transistor into linear region of operation and thus reducing the overall spread of the slew).

However, in some examples, it may not be desirable to add a resistance to the driver. For instance, while adding a resistance to a driver may result in desirable slew rate control, this technique may not help in meeting the delay requirements because the behavior of the driver is linearized. Additionally, it may not be desirable to add a resistance because the resulting size of the MOS transistor needed to meet the DC requirements of the pad may be large which results in undesirable area usage.

As another example, the slew rate of an output driver may be controlled by utilizing a staggered driver. For instance, the output driver transistor may be fingered and separately controlled. In operation, the gates of the fingered driver may activated slowly to reduce the dv/dt of the output signal.

However, in some examples, it may not be desirable to use a staggered driver. For instance, as the output driver gate is turned on slowly, the propagation delay contribution from the driver increases in the same ratio which increases the difficulty of meeting the delay requirement when maintaining the slow slew rate. While it may be possible to optimize the delay achieved by controlling the ratio of the driver fingers that can be turned on but this method still has some limitations in what results can be achieved. Additionally, the complexity and area of the pre-driver logic needed to implement gate control for driver fingers is increased by using such a staggered driver.

As another example, the slew rate of an output driver may be controlled by adding a miller capacitance (e.g., a capacitance between the gate and the drain of the output driver). The gate of the output driver may be controlled such that the slew rate is based on the rate of change of voltage across the load capacitance.

However, in some examples, it may not be desirable to use a miller capacitance. For instance, utilizing a miller capacitance may not be very effective to address PVT variations. Additionally, a miller capacitance may also slow down the output driver such that delay requirements may be more difficult to meet. Furthermore, there may also be an area disadvantage as the size of the miller capacitance required to control the slew rate may be large.

As another example, the slew rate of an output driver may be controlled by controlling of the gate of the output driver (similar to the miller capacitance approach). In some examples, the gate of the output driver may be controlled based on feedback from the pad to which the driver outputs the output signal. For instance, the output signal may be detected and used to control the gates of the output driver. The feedback from the pad could be used either to turn on a few gate fingers or it could be used to control the pre-driver. While using feedback from the pad may address the slew rate problem, it may also cause difficulties for meeting the delay requirement.

In some examples, the gate of the output driver may be controlled by using a current controlled pre-driver. For instance, the pre-driver may be controlled with a current supplied by a bandgap or from any other current source circuit such that the current is mostly constant over various PVT conditions. As the current would be a constant current over PVT conditions, the rate at which the gate of the output driver is charged may also be constant which may help the driver achieve a controlled slew over PVT's. However, in some examples, it may not be desirable to utilize a current controlled pre-driver to control the gate of the output driver (e.g., when the load is variable). Additionally, as the gate of the output driver is charged at a constant rate, using a current controlled pre-driver does not address the delay problem. Furthermore, this technique may result in static current consumption, which may not be desirable.

In accordance with one or more techniques of this disclosure, a plurality of the above techniques may be combined to create an output driver with desirable slew rate control over various PVT conditions, desirable propagation delay, and desirable DC characteristics. For example, a first driver that utilizes an additional resistance may be combined with a second driver that utilizes feedback from the pad to form an output driver that has a desirable slew rate, delay, and DC characteristics.

FIG. 1 is a conceptual diagram illustrating example output driver 2, in accordance with one or more techniques of this disclosure. Output driver 2 may be configured to generate an output signal in response to receiving an input signal. For instance, responsive to receiving an input signal at input 12, output driver 2 may generate an output signal at output 14. In some examples, output driver 2 may be included in an integrated circuit, such as an integrated circuit used to communicate data over a wired interface. As illustrated in the example of FIG. 1, output driver 2 may include driver 6, feedback logic 8, and driver 10.

In some examples, output driver 2 may include driver 6 which may be configured to generate an output signal based on a control signal. For instance, driver 6 may utilize the input signal received at input 12 as a control signal and generate an output signal for output at output 14 responsive to determining that a voltage level of the input signal satisfies an input voltage threshold.

In some examples, output driver 2 may include feedback logic 8 which may be configured to generate a control signal based on one or more signals, such as the input signal and output signal of output driver 2. For instance, feedback logic 8 may be configured to activate driver 10 responsive to determining that both the voltage level of the input signal satisfies the input voltage threshold and that a voltage level of the output signal satisfies an output voltage threshold.

In some examples, output driver 2 may include driver 10 which may be configured to generate an output signal based on a control signal. For instance, driver 10 may generate an output signal for output at output 14 responsive to receiving a control signal from feedback logic 8.

In some examples, driver 10 may have different properties than driver 6. As one example, driver 10 may be configured to switch a larger amount of current than driver 6. As another example, driver 6 may have a faster slew rate than driver 10. As another example, driver 10 may be sized differently than driver 6.

As discussed above, responsive to receiving an input signal at input 12, output driver 2 may generate an output signal at output 14. In some examples, output driver 2 may be configured to generate the output signal in compliance with one or more requirements such as one or more of a slew rate requirement, a propagation delay requirement, and one or more DC requirements.

In accordance with one or more techniques of this disclosure, driver 6 and driver 10 may collectively generate the output signal at output 14 in compliance with one of more of the requirements. For instance, driver 6 may be used to satisfy a slew rate requirement and may be controlled based on the input signal, and driver 10 may be used to satisfy one or more DC requirements and may be controlled based on both the input signal and the output signal.

In operation, driver 6 and feedback logic 8 may receive the input signal via input 12. Responsive to determining that a voltage level of the input signal satisfies an input voltage threshold, driver 6 may activate and begin generating the output signal. In some examples, the input signal may be a binary signal and driver 6 may determine that voltage level of the input signal satisfies the threshold when the binary signal toggles (i.e., switches from "0" to "1" and vice versa).

In any case, feedback logic 8 may selectively activate driver 10 based on both the output signal and the input signal. For instance, feedback logic 8 may toggle activation of driver 10 responsive to determining that both the voltage level of the input signal satisfies the input voltage threshold and that a voltage level of the output signal satisfies one or more output voltage thresholds.

As one example, feedback logic 8 may activate driver 10 where the voltage level of the output signal is greater than a first output voltage threshold (e.g., 80% of the desired level). In other words, driver 6 may generate the output signal until the voltage level of the output signal crosses the first output voltage threshold, at which point driver 6 and driver 10 may collectively generate the output signal until the input signal no longer satisfies the input voltage threshold. In this way, driver 6 may be used to satisfy a slew rate requirement, driver 10 may be used to satisfy one or more DC requirements, while the combination of driver 6 and driver 8 may be used to satisfy a propagation delay requirement.

As another example, feedback logic 8 may activate driver 10 where the voltage level of the output signal is less than a second output voltage threshold (e.g., 20% of the desired level). In other words, driver 6 and driver 10 may collectively generate the output signal until the voltage level of the output signal crosses the second output voltage threshold, at which point driver 10 may deactivate and driver 6 may generate the output signal until the input signal no longer satisfies the input voltage threshold. In this way, driver 6 may be used to satisfy a slew rate requirement, driver 10 may be used to satisfy one or more DC requirements, while the combination of driver 6 and driver 8 may be used to satisfy a propagation delay requirement.

As yet another example, feedback logic 8 may activate driver 10 where the voltage level of the output signal is greater than the first output voltage threshold and where the voltage level of the output signal is less than the second output voltage threshold. In other words, driver 6 and driver 10 may collectively generate the output signal until the voltage level of the output signal crosses the second output voltage threshold, at which point driver 10 may deactivate and driver 6 may generate the output signal until the voltage level of the output signal crosses the first output voltage threshold, at which driver 6 and driver 10 may again collectively generate the output signal until the input signal no longer satisfies the input voltage threshold. In this way, driver 6 may be used to satisfy a slew rate requirement, driver 10 may be used to satisfy one or more DC requirements, while the combination of driver 6 and driver 8 may be used to satisfy a propagation delay requirement.

Figure 2:
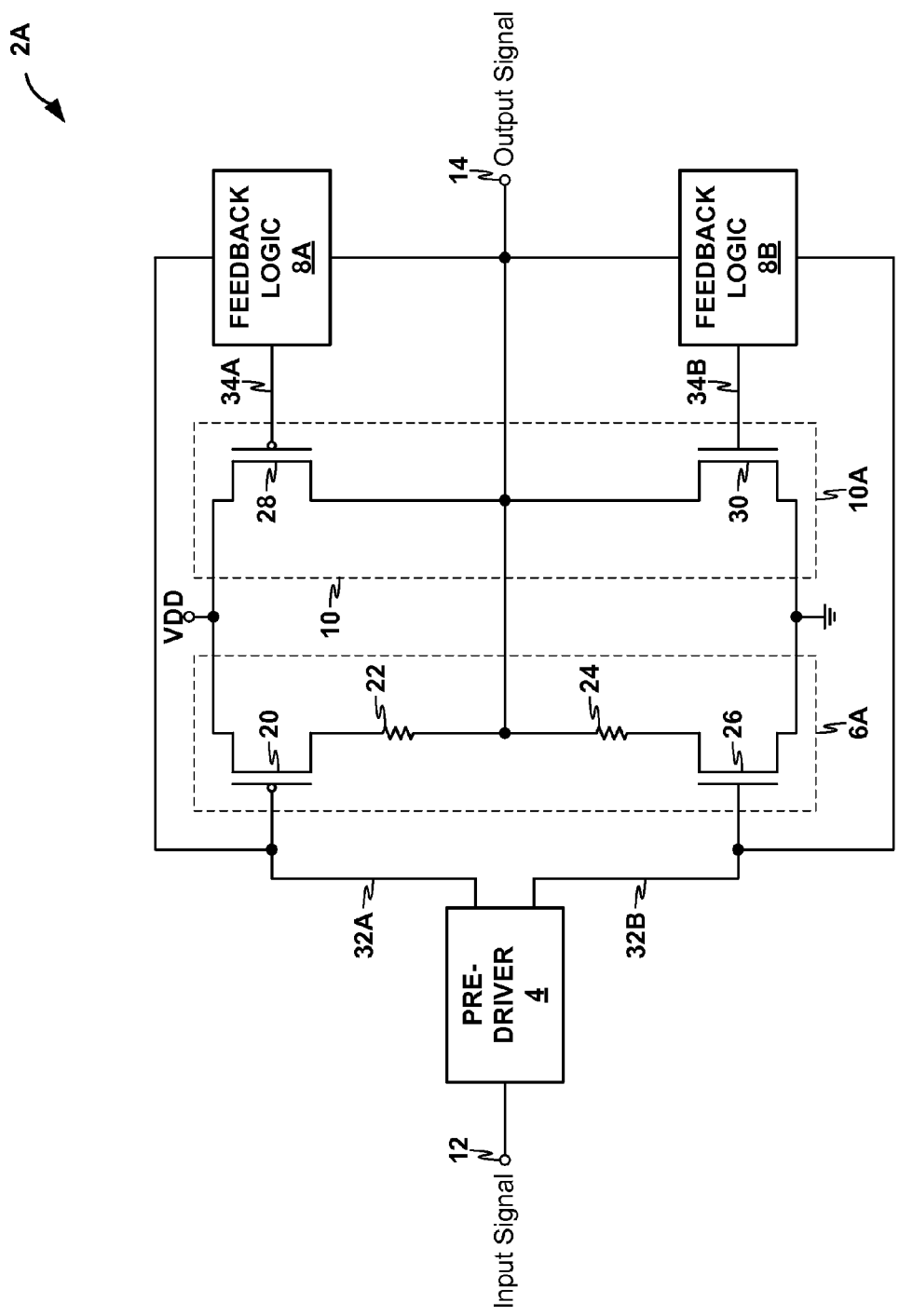
FIG. 2 is a schematic and conceptual diagram illustrating further details of drivers included in the output driver of FIG. 1, in accordance with one or more examples of this disclosure.

FIG. 2 is a schematic and conceptual diagram illustrating further details of drivers included in the output driver of FIG. 1, in accordance with one or more examples of this disclosure. As illustrated in FIG. 2, output driver 2A may include pre-driver 4, driver 6, feedback logics 8A-8B, and driver 10.

In some examples, output driver 2A may include pre-driver 4 which may be configured to receive an input signal, perform one or more operations to condition the input signal, and output the conditioned signal to one or more components of output driver 2A. For instance, pre-driver 4 may perform level shifting to convert a voltage range of the input signal to a voltage range of one or more transistors of driver 6 and/or driver 10. In addition to conditioning the input signal, pre-driver 4 may be configured to generate one or more control signals 32A-32B (collectively, "control signals 32") based on the input signal. For instance, responsive to determining that the voltage level of the input signal is transitioning from low to high, pre-driver 4 may output one or more of control signals 32 to cause one or more drivers to activate (one or more pull-down drivers where output driver 2A is inverting, or one or more pull-up drivers where output driver 2A is non-inverting). Similarly, responsive to determining that the voltage level of the input signal is transitioning from high to low, pre-driver 4 may output one or more of control signals 32 to cause one or more drivers to activate (one or more pull-down drivers where output driver 2A is non-inverting, or one or more pull-up drivers where output driver 2A is inverting).

In some examples, output driver 2A may include driver 6A which may be configured to perform operations similar to driver 6 of FIG. 1. For instance driver 6A may be configured to generate an output signal based on a control signal. In some examples, driver 6A may generate the output signal using a push configuration, a pull configuration, and/or a push-pull configuration. As illustrated in FIG. 2, driver 6A is a push-pull configuration that includes driver 20 and resistor 22 configured to pull-up the voltage level of the output signal at output 14 (e.g., to VDD) along with resistor 24 and driver 26 configured to pull-down the voltage level of the output signal at output 14 (e.g., to ground). As discussed above, respectively including resistor 22 and resistor 24 in the paths of driver 20 and driver 26 may control the slew rates of driver 20 and driver 26 such that driver 20 and driver 26 operate in a linear region.

While respectively illustrated in FIG. 2 as a PMOS transistor and an NMOS transistor, driver 20 and driver 26 may be any device capable of switching electrical current. For instance, driver 20 and/or 26 may include one or more PMOS transistors, one or more NMOS transistors, one or more bipolar junction transistors, and the like. Pre-driver 4 may be configured such that output driver 2A performs the same operation regardless of the type of switching devices included in driver 20 and driver 26.

In some examples, output driver 2A may include driver 10A which may be configured to perform operations similar to driver 10 of FIG. 1. For instance driver 10A may be configured to generate an output signal based on a control signal. In some examples, driver 10A may generate the output signal using a push configuration, a pull configuration, and/or a push-pull configuration. As illustrated in FIG. 2, driver 10A is a push-pull configuration that includes PMOS driver 28 configured to pull-up the voltage level of the output signal at output 14 (e.g., to VDD) along with NMOS driver 30 configured to pull-down the voltage level of the output signal at output 14 (e.g., to ground).

While respectively illustrated in FIG. 2 as a PMOS transistor and an NMOS transistor, driver 28 and driver 28 may be any device capable of switching electrical current. For instance, driver 28 and/or 28 may include one or more PMOS transistors, one or more NMOS transistors, one or more bipolar junction transistors, and the like. Feedback logics 8A-8B may be configured such that output driver 2A performs the same operation regardless of the type of switching devices included in driver 28 and driver 26.

In some examples, output driver 2A may include feedback logics 8A-8B which may be configured to perform operations similar to feedback logic 8 of FIG. 1. For instance, each of feedback logics 8A-8B may be configured to generate a control signal based on one or more signals, such as the output signal at output 14 and one or more of control signals 32. As one example, feedback logic 8A may generate control signal 34A based on control signal 32A and the output signal. As another example, feedback logic 8B may generate control signal 34B based on control signal 32B and the output signal.

In accordance with one or more techniques of this disclosure, driver 6A and driver 10A may collectively generate the output signal at output 14 in compliance with one of more design requirements. In the following example, output driver 2A is described as a non-inverting driver where the voltage level of the output signal at output 14 may be pulled up when the input signal corresponds to a logic high (e.g., "1") level, and pulled down when the input signal corresponds to a logic low (e.g., "0") level. However, the techniques of this disclosure are equally applicable where output driver 2A is in an inverting configuration where the voltage level of the output signal at output 14 may be pulled up when the input signal corresponds to a logic low (e.g., "0") level, and pulled down when the input signal corresponds to a logic high (e.g., "1") level.

In operation, the voltage level of the input signal at input 12 may initially be high and output driver 2A may pull-up the voltage level of the output signal at output 14. For instance, one or both of driver 20 and driver 28 may pull pre-driver 4 may pull the voltage level of the output signal at output 14 up to VDD (i.e., in response to control signal 32A and/or control signal 34A).

In any case, when the voltage level of input signal transitions from high to low, output driver 2A may pull-down the voltage level of the output signal at output 14. For instance, responsive to determining that the voltage level of the input signal is less than an input voltage threshold, pre-driver 4 may output control signal 32B to driver 26 and feedback logic 8B. Responsive to receiving control signal 32B, driver 26 may activate and begin to pull-down the voltage level of the output signal and feedback logic 8B may determine whether to activate driver 30 (e.g., whether to output control signal 34B). For instance, feedback logic 8B may activate driver 30 responsive to determining that a voltage level of the output signal is greater than a first output voltage threshold. In other words, responsive to receiving control signal 32B (i.e., determining that both the voltage level of the input signal satisfies the input voltage threshold) and determining that the voltage level of the output signal satisfies an output voltage threshold, feedback logic 8B may output control signal 34B such that driver 30 activates and pulls-down the voltage level of the output signal.

As the voltage level of the output signal is being pulled down, feedback logic 8B may continue to determine whether the voltage level of the output signal satisfies the first output voltage threshold. Responsive to determining that the voltage level of the output signal no longer satisfies (i.e., is less than) the first output voltage threshold, feedback logic 8B may deactivate driver 30, such as be ceasing to output control signal 34B, such that driver 30 stops pulling-down the voltage level of the output signal. However, as driver 26 remains active, the voltage level of the output signal may continue to be pulled-down.

As the voltage level of the output signal continues to decrease, feedback logic 8B may determine whether the voltage level of the output signal satisfies (i.e., is less than) a second output voltage threshold. Responsive to determining that the voltage level of the output signal is less than the second output voltage threshold, feedback logic 8B may activate driver 30, such as be outputting control signal 34B, such that driver 30 begins to pull-down the voltage level of the output signal. However, as driver 26 remains active, the voltage level of the output signal may continue to be pulled-down. In other words, driver 26 may be active during a time period where the voltage level of the input signal is less than the input signal threshold and driver 30 may be active during one or both of (1) a time period where the voltage level of the input signal is less than the input signal threshold and the voltage level of the output signal is greater than a first output voltage threshold, and (2) a time period where the voltage level of the input signal is less than the input signal threshold and the voltage level of the output signal is less than a second output voltage threshold. In this way, driver 26 and driver 30 may collectively generate the output signal in compliance with the one or more design requirements.

In some examples, driver 20 and driver 28 may perform operations similar to driver 26 and driver 30 when the voltage level of the input signal transitions from low to high. For instance driver 20 may be active during a time period where the voltage level of the input signal is greater than the input signal threshold and driver 28 may be active during one or both of (1) a time period where the voltage level of the input signal is greater than the input signal threshold and the voltage level of the output signal is less than a third output voltage threshold, and (2) a time period where the voltage level of the input signal is greater than the input signal threshold and the voltage level of the output signal is greater than a fourth output voltage threshold. In some examples, the third output voltage threshold and the fourth output voltage threshold may respectively mirror the first output voltage threshold and the second output voltage threshold. For instance, where the first output voltage threshold is 20% of the steady state pulled-down voltage of the output signal, the third output voltage threshold may be 20% of the steady state pulled-up voltage of the output signal. In this way, driver 20 and driver 28 may collectively generate the output signal in compliance with the one or more design requirements.

Figure 3:
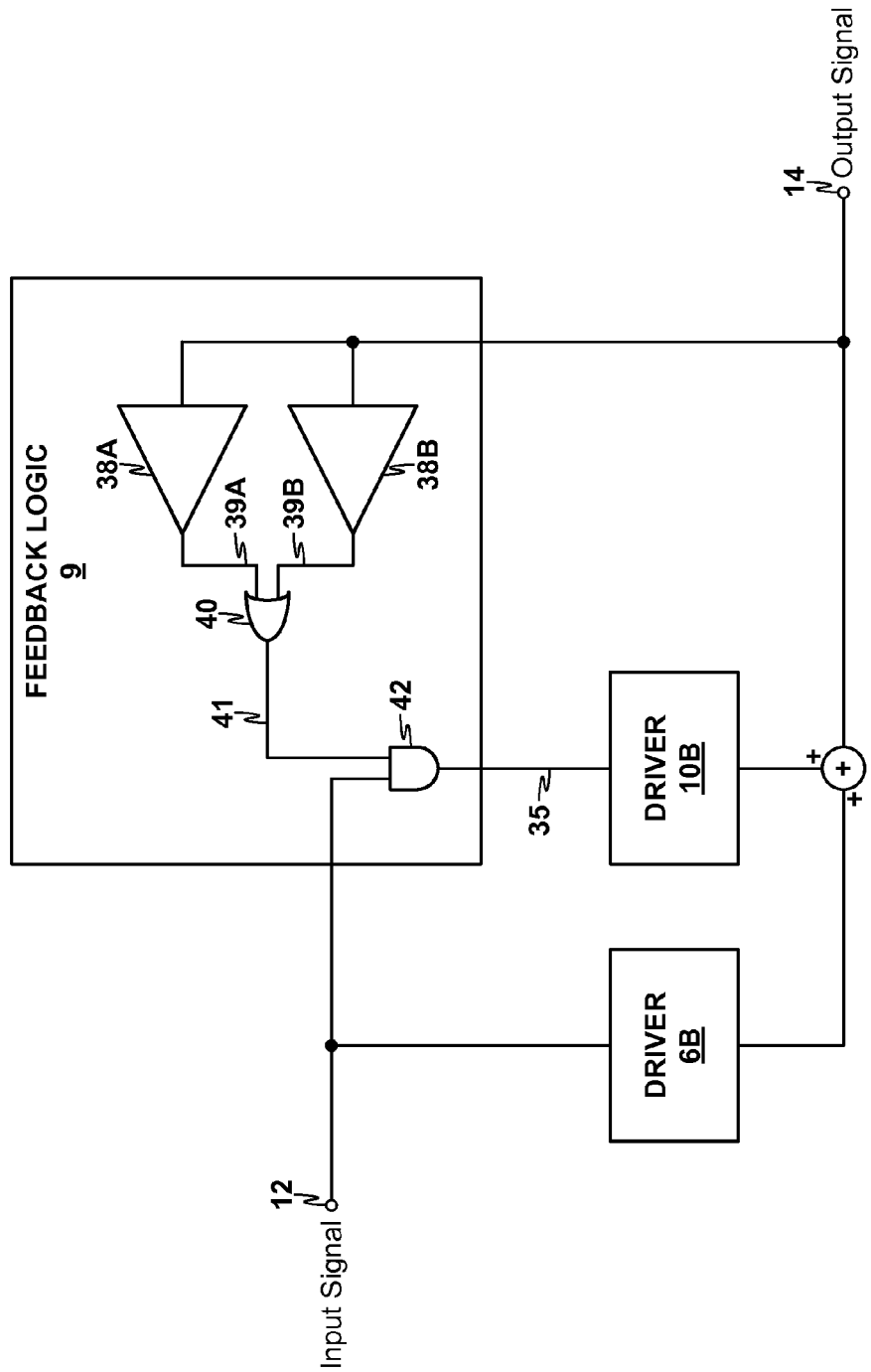
FIG. 3 is a schematic and conceptual diagram illustrating further details of feedback logic included in the output driver of FIG. 1, in accordance with one or more examples of this disclosure.

FIG. 3 is a schematic and conceptual diagram illustrating further details of feedback logic included in the output driver of FIG. 1, in accordance with one or more examples of this disclosure. As illustrated in FIG. 3, output driver 2B may include driver 6, feedback logic 8, and driver 10.

In some examples, output driver 2B may include driver 6B which may be configured to perform operations similar to driver 6 of FIG. 1 and/or driver 6A of FIG. 2. For instance driver 6B may be configured to generate an output signal based on a control signal. As illustrated in FIG. 3, driver 6B may generate the output signal based on the input signal received at input 12.

In some examples, output driver 2B may include driver 10B which may be configured to perform operations similar to driver 6 of FIG. 1 and/or driver 10A of FIG. 2. For instance driver 10B may be configured to generate an output signal based on a control signal. As illustrated in FIG. 3, driver 10B may generate the output signal based on a control signal generated by feedback logic 9.

In some examples, output driver 2B may include feedback logic 9 which may be configured to perform operations similar to feedback logic 8 of FIG. 1 and/or feedback logics 8A-8B of FIG. 2. For instance, feedback logic 9 may be configured to generate a control signal based on one or more signals, such as the output signal at output 14 and one or more of control signals 32. As one example, feedback logic 9 may generate control signal 35 based on the input signal and the output signal. As illustrated in FIG. 3, feedback logic

9 may include comparators 38A-38B (collectively, "comparators 38"), OR gate 40, and AND gate 42.

In some examples, feedback logic 9 may include one or more comparators 38 which may be generate a control signal that indicates whether or not a voltage level of an input signal satisfies a voltage threshold. As one example, comparator 38A may output control signal 39A that indicates whether the voltage level of the output signal satisfies a first voltage threshold. As another example, comparator 38B may output control signal 39B that indicates whether the voltage level of the output signal satisfies a second voltage threshold.

In some examples, one or both of comparators 39 may be an inverter with a skewed switching threshold voltage. For instance, as opposed to having a 50% switching threshold, one or both of comparators 39 may be an inverter with a switching threshold that is either >>50% or <<50%. As one example, comparator 38A may have a very low/very high switching threshold for signal rise/fall. As another example, comparator 38B may have a very high/very low switching threshold for signal rise/fall.

Therefore, where the voltage level of the output signal begins to rise/fall, comparator 38A (i.e., with a very low switching threshold (<<<50%)) may detect the signal state and toggle the logic level of control signal 39A when the voltage level of the output signal reaches the first threshold voltage (e.g., 20% of its final signal level). This switching of the logic level of control signal 39A may cause driver 10B to deactivate.

Thus after the first threshold of signal rise/fall, driver 6B may be active while driver 10B is inactive. In the meanwhile, comparator 38B (i.e., with a very high/low switching threshold for signal rise/fall) may not toggle the logic level of control signal 39B as the voltage level of the output signal has not yet satisfied a second threshold (e.g., 80% of its final signal level).

Therefore, from the first threshold until the second threshold, the output signal slope is determined mainly by driver 6B. As discussed above, driver 6B may be configured to have a linear behavior. Since the behavior is linear the slew rate may be controlled over this entire range of the output signal for various process, voltage and temperature (PVT) conditions.

Once the output signal reaches the second threshold of its level, comparator 38B may detect the state change and toggle the logic level of control signal 39B when the voltage level of the output signal reaches the second threshold voltage (e.g., 80% of its final signal level). By toggling control signal 39B, comparator 38B may cause driver 10B to activate again after the second threshold of the signal rise/fall. In this way, output driver 2B may satisfy one or more of the DC requirements of the output signal/pad.

So initially, since driver 10B is activated (e.g., immediately & completely), it may aid in the charging of the load capacitance and thus satisfy one or more initial delay requirements. After that, when driver 10B is deactivated, the slew rate of the output signal is controlled by driver 6B. Finally, driver 10B is activated again towards the end of the signal rise/fall (after reaching 80% of the signaling level) to satisfy the one or more DC requirements of the output signal/pad.

In some examples, the switching thresholds used by comparators 38 may be selected and/or adjusted based on one or more delay requirements. The size of driver 6B and the value of a resistor included in driver 6B (i.e., as discussed above), may also be designed based on the slew requirement e.g., without any impact on either the delay or the DC strength of the output driver. In this way, driver 6B and driver 10B may collectively achieve both the slew rate & delay requirements of the output driver in parallel and not at the cost of one another.

Additional advantages of an output driver that includes two drivers with different properties (i.e., driver 6 and driver 10) include, but are not limited to, the lack of area increase because the existing strength of the output driver is used as determined from the DC requirement. Similarly, because there is no static current consumption, the complexity and area of any slew control logic may be reduced.

Figure 4:
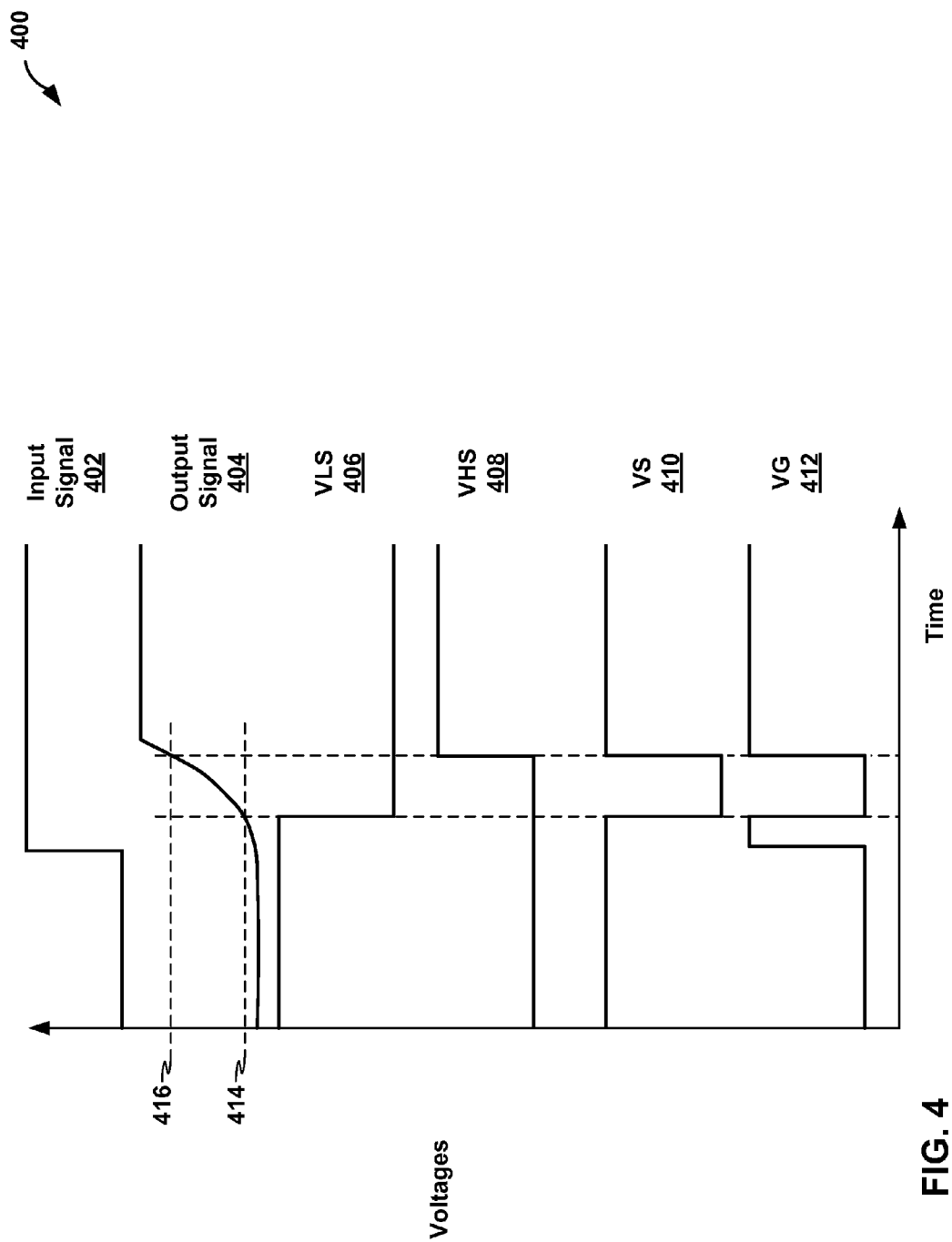
FIG. 4 is a graph illustrating example signals that may correspond to signals within an output driver, in accordance with one or more techniques of this disclosure.

FIG. 4 is a graph illustrating example signals that may correspond to signals within an output driver, in accordance with one or more techniques of this disclosure. As illustrated by FIG. 4, graph 400 may include a horizontal axis representing time, a vertical axis representing voltages, and a plurality of signals 402-412. For purposes of illustration, signals 402-412 are described within the context of output driver 2B of FIG. 3, although output drivers having configurations different that than of output driver 2B may generate the signals of FIG. 4.

In some examples, input signal 402 may be an example of the input signal received by output driver 2B at input 12, output signal 404 may be an example of the output signal generated by output driver 2B at output 14, VLS 406 may be an example of control signal 39B generated by comparator 38B, VHS 408 may be an example of control signal 39A generated by comparator 38A, VS 410 may be an example of control signal 41 generated by OR gate 40, and VG 412 may be an example of control signal 35 generated by AND gate 42. As such, VS 410 may be an "OR" of VLS 406 and VHS 408, and VG may be an "AND" or VS 410 and input signal 402.

In accordance with one or more techniques of this disclosure, output driver 2B may receive input signal 402 at input 12 and generate output signal 404 at output 14. As illustrated by graph 400, output driver 2B may be non-inverting such that while the voltage level of input signal 402 is low, the voltage level of output signal 404 is low and vice versa. As discussed above, driver 6B may be directly controlled by input signal 402 such that when input signal 402 is logic high (e.g., "1"), driver 6B may begin to pull-up the voltage level of output signal 404 and vice versa.

As discussed above, OR gate 40 may output VS 410 as logic high where either or both of VLS 408 or VHS 410 are logic high. As illustrated by graph 400, comparator 38B may output VLS 406 as logic high where the voltage level of output signal 404 is less than first output threshold 414 and comparator 38A may output VHS 408 as logic high where the voltage level of output signal 404 is greater than second output threshold 416. As such, VS 410 may be logic high when the voltage level of output signal 404 is less than first output threshold 414 and when the voltage level of output signal 404 is greater than second output threshold 416. As driver 10B is controlled by VG 412, driver 10B may be active when VG 412 is logic high.

Figure 5:
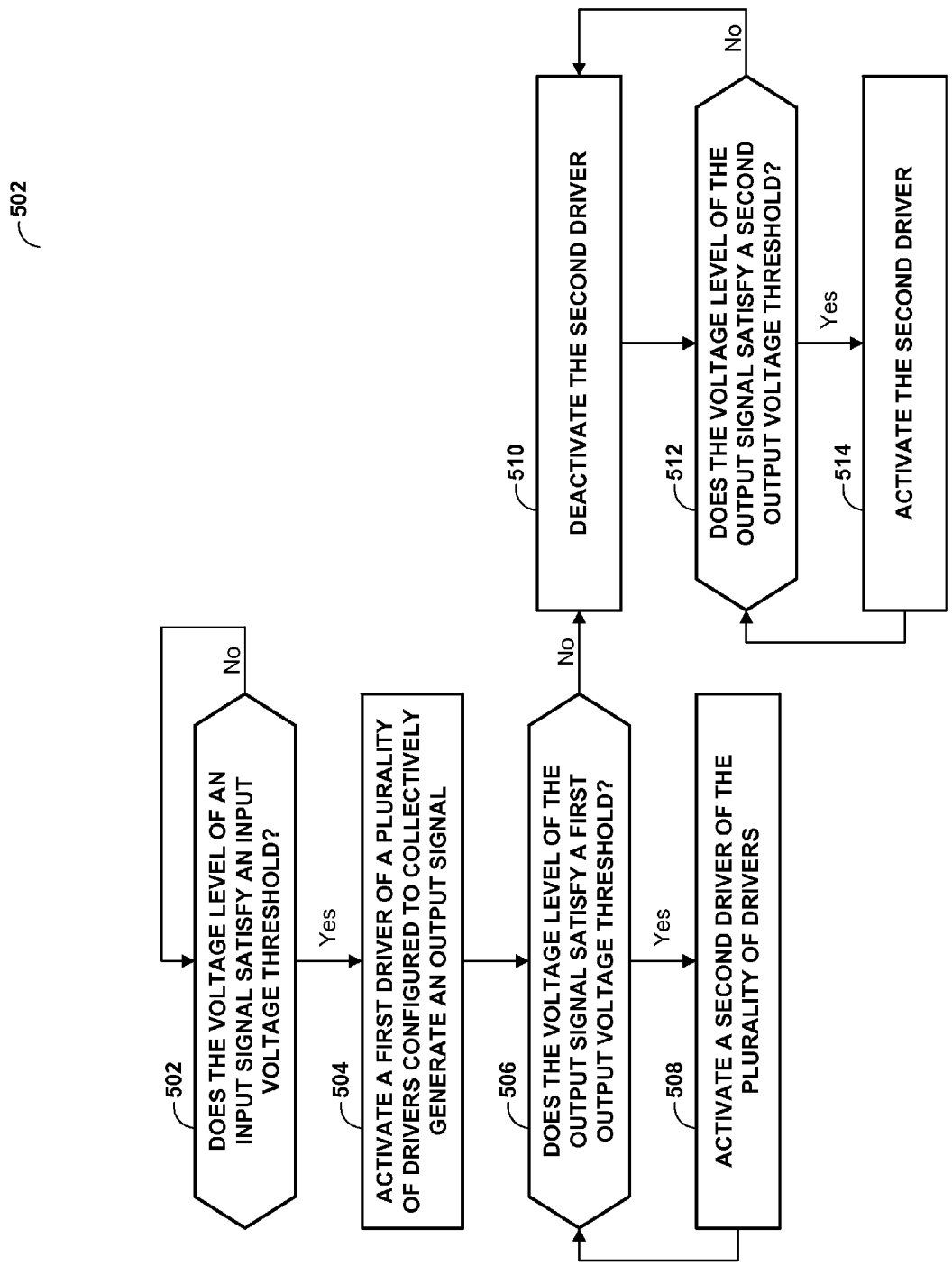
FIG. 5 is a flowchart illustrating example operations of an example battery powered motor system, in accordance with one or more techniques of this disclosure.

FIG. 5 is a flowchart illustrating example operations of an example battery powered motor system, in accordance with one or more techniques of this disclosure. For purposes of illustration only, the example operations are described below within the context of output driver 2B of FIG. 3, although output drivers having configurations different that than of output driver 2B may generate the signals of FIG. 4.

In accordance with one or more techniques of this disclosure, output driver 2B may determine whether the voltage level of an input signal satisfied an input voltage threshold (502). For instance, output driver 2B may determine whether the voltage level of the input signal received at input 14 is greater than 50% of its logic high level. Responsive to determining that the voltage level of the input signal does not satisfy the input voltage threshold ("No" branch of 502), output driver 2B may continue to monitor the voltage level of the input signal to determine whether the voltage level of the input signal satisfies the input voltage threshold (502).

Responsive to determining that the voltage level of the input signal satisfies the input voltage threshold ("Yes" branch of 502), output driver 2B may activate a first driver of a plurality of drivers configured to collectively generate an output signal (504). For example, output driver 2B may activate driver 6B which may pull-up/pull-down the voltage level of the output signal depending on whether or not output driver 2B is inverting or non-inverting. In addition to activating the first driver, output driver 2B may determine whether the voltage level of the output signal satisfies a first output voltage threshold (506). For instance feedback logic 9 may determine whether the voltage level of the output signal is less than e.g., 20% of its logic high level.

Responsive to determining that the voltage level of the output signal satisfies the first output voltage threshold ("Yes" branch of 506), output driver 2B may activate a second driver of the plurality of drivers. For example, output driver 2B may activate driver 10B which may, along with driver 6B, pull-up/pull-down the voltage level of the output signal, depending on whether or not output driver 2B is inverting or non-inverting. As the voltage level of the output signal is rising/falling, output driver 2B may continue to monitor the voltage level of the output signal to determine whether the voltage level of the output signal still satisfies the first output voltage threshold (506). Responsive to determining that the voltage level of the output signal does not satisfy the first output voltage threshold ("No" branch of 506), output driver 2B may deactivate the second driver (510). For instance, as the voltage level of the output signal is rises above/falls below the first output voltage threshold, output driver 2B may deactivate driver 10B such that the output signal is generated by driver 6B, e.g., without the assistance of driver 10B.

Output driver 2B may continue to monitor the voltage level of the output signal to determine whether the voltage level of the output signal satisfies a second output voltage threshold (512). For instance feedback logic 9 may determine whether the voltage level of the output signal is greater than e.g., 80% of its logic high level. Responsive to determining that the voltage level of the output signal satisfies the second output voltage threshold ("Yes" branch of 512), output driver 2B may activate the second driver (514).

As discussed above, the first driver (e.g., driver 6B) may be configured to satisfy one or more slew rate requirements and the second driver (e.g., driver 10B) may be configured to satisfy one or more delay and/or DC requirements. As such in this way, the first driver and the second driver may collectively generate the output signal such that it satisfies the slew rate requirements, the delay requirements, and the DC requirements.

Additionally, as discussed above, in some examples, output driver 2B may activate the second driver based on one or more thresholds. As one example, output driver 2B may activate the second driver during two time periods (when the output signal transitions from low to high, similar conditions for when the output signal transitions from high to low), (1) when the voltage level of the output signal is less than a first threshold, and (2) when the voltage level of the output signal is greater than a second threshold. As another example, output driver 2B may activate the second driver only when the voltage level of the output signal is less than the first threshold. As another example, output driver 2B may activate the second driver only when the voltage level of the output signal is greater than the second threshold.

An example application for the techniques of this disclosure is an output driver operating on a controller area network (CAN) bus. In some examples, the CAN bus specification may describe a slew requirement of 60 mv/ns for signal rise/fall from 20%-80% and 80%-20% respectively, and a propagation delay requirement of 10 ns from 50% of the input signal to reach 20% of the output signal. However, with 60 mV/ns of slew rate, the time required to reach 20% would be 10 ns in 3V configurations, and 16.67 ns in 5V configurations. As such, it may be a challenging for a driver to meet the delay requirement of 10 ns (including the propagation delay from the input signal to output driver). Additionally, considering all the variations over process, voltage, and temperature, meeting the delay requirement becomes further challenging.

In accordance with one or more techniques of this disclosure, an output driver, such as output driver 2, may include a first driver with a slew rate that satisfies the CAN requirement of 60 mV/ns, such as driver 6, and a second driver that satisfies the propagation delay requirement of 10 ns, such as driver 10. When the input signal toggles (i.e., transitions from low to high), the first driver may activate and pull-up the voltage level of the output signal until the input signal transitions back to low. Additionally, the second driver may activate during one or periods. As one example, the second driver may activate when both the input signal is high and the voltage level of the output signal is below a first output threshold. As another example, the second driver may activate when both the input signal is high and the voltage level of the output signal is greater than a second output threshold. As another example, the second driver may activate when both the input signal is high and the voltage level of the output signal is below a first output threshold, deactivate when the voltage level of the output signal is between the first output threshold and the second output threshold, and reactivate when the voltage level of the output signal is greater than the second output threshold. In these ways, output driver 2 may satisfy the slew, propagation delay, and DC requirements of the CAN specification.

The following examples may illustrate one or more aspects of the disclosure.

EXAMPLE 1

A method comprising: in response to a voltage level of an input signal satisfying an input voltage threshold, activating a first driver of a plurality of drivers configured to collectively generate an output signal; and in response to the voltage level of the input signal satisfying the input voltage threshold and a voltage level of the output signal satisfying an output voltage threshold, toggling activation of a second driver of the plurality of drivers, wherein the second driver is configured to switch more current when activated than the first driver, and wherein the first driver has a faster slew rate than the second driver.

EXAMPLE 2

The method of example 1, further comprising: determining that the voltage level of the output signal satisfies the output voltage threshold where the voltage level of the output signal is greater than the output voltage threshold, and wherein toggling activation of the second driver of the plurality of drivers comprises activating the second driver.

EXAMPLE 3

The method of any combination of examples 1-2, wherein the output voltage threshold is a first output voltage threshold, the method further comprising: in response to the voltage level of the input signal satisfying the input voltage threshold and that the voltage level of the output signal being less than a second output voltage threshold, activating the second driver; and responsive to the voltage level of the output signal being between the first output voltage threshold and the second output voltage threshold, deactivating the second driver.

EXAMPLE 4

The method of any combination of examples 1-3, wherein the first driver includes a resistance configured to modify the slew rate of the first driver.

EXAMPLE 5

The method of any combination of examples 1-4, wherein: activating the first driver comprises activating a first push driver of the plurality of drivers, and toggling activation of the second driver comprises toggling activation of a second push driver of the plurality of drivers, or activating the first driver comprises activating a first pull driver of the plurality of drivers, and toggling activation of the second driver comprises toggling activation of a second pull driver of the plurality of drivers.

EXAMPLE 6

The method of any combination of examples 1-5, wherein the output signal is a communications signal of a controller area network (CAN) bus.

EXAMPLE 7

An output driver comprising: a plurality of drivers configured to collectively generate an output signal, wherein: a first driver of the plurality of drivers is configured to activate responsive to a voltage level of an input signal satisfying an input voltage threshold, a second driver of the plurality of drivers is configured to toggle activation responsive to the voltage level of the input signal satisfying the input voltage threshold and a voltage level of the output signal satisfying an output voltage threshold, wherein the second driver is configured to switch more current when activated than the first driver, and wherein the first driver has a faster slew rate than the second driver.

EXAMPLE 8

The output driver of example 7, wherein: the voltage level of the output signal satisfies the output voltage threshold where the voltage level of the output signal is greater than the output voltage threshold, and the second driver is configured to activate by at least activating.

EXAMPLE 9

The output driver of any combination of examples 7-8, wherein: the output voltage threshold is a first output voltage threshold, the second driver is configured to activate responsive to the voltage level of the input signal satisfying the input voltage threshold and that the voltage level of the output signal being less than a second output voltage threshold, and the second driver is configured to deactivate responsive to the voltage level of the output signal being between the first output voltage threshold and the second output voltage threshold.

EXAMPLE 10

The output driver of any combination of examples 7-9, further comprising: a resistance configured to modify the slew rate of the first driver.

EXAMPLE 11

The output driver of any combination of examples 7-10, wherein: the first driver is configured to activate by at least activating a first push driver of the plurality of drivers, and the second driver is configured to toggle activation by at least toggling activation of a second push driver of the plurality of drivers, or the first driver is configured to activate by at least activating a first pull driver of the plurality of drivers, and the second driver is configured to toggle activation by at least toggling activation of a second pull driver of the plurality of drivers.

EXAMPLE 12

The output driver of any combination of examples 7-11, wherein the output signal is a communications signal of a controller area network (CAN) bus.

EXAMPLE 13

An output driver comprising: a plurality of means for collectively generating an output signal; and means for controlling the means for collectively generating the output signal configured to: activate a first means of the plurality of means for collectively generating the output signal responsive to a voltage level of an input signal satisfying an input voltage threshold, toggle activation of a second means of the plurality of means for collectively generating the output signal responsive to the voltage level of the input signal satisfying the input voltage threshold and a voltage level of the output signal satisfying an output voltage threshold, wherein the second means is configured to switch more current when activated than the first means, and wherein the first means has a faster slew rate than the second means.

EXAMPLE 14

The output driver of example 13, wherein the means for controlling are configured to: determine that the voltage level of the output signal satisfies the output voltage threshold where the voltage level of the output signal is greater than the output voltage threshold, and toggle activation of the second means of the plurality of drivers by at least activating the second means.

EXAMPLE 15

The output driver of any combination of examples 13-14, wherein the output voltage threshold is a first output voltage threshold, and wherein the means for controlling are configured to: activate the second means responsive to the voltage level of the input signal satisfying the input voltage threshold and that the voltage level of the output signal being less than a second output voltage threshold, and deactivate the second means responsive to the voltage level of the output signal being between the first output voltage threshold and the second output voltage threshold.

EXAMPLE 16

The output driver of any combination of examples 13-15, further comprising: means for modifying the slew rate of the first driver.

EXAMPLE 17

The output driver of any combination of examples 13-16, wherein the means for controlling are configured to: activate the first means by at least activating a first push means of the plurality of means, and toggling activation of the second means by at least toggling activation of a second push means of the plurality of means, or activating the first means by at least activating a first pull means of the plurality of means, and toggling activation of the second means by at least toggling activation of a second pull means of the plurality of means.

EXAMPLE 18

The output driver of any combination of examples 13-17, wherein the output signal is a communications signal of a controller area network (CAN) bus.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

The invention claimed is:

1. A method comprising:
in response to a voltage level of an input signal satisfying an input voltage threshold, activating a first driver of a plurality of drivers configured to collectively generate an output signal; and
in response to the voltage level of the input signal satisfying the input voltage threshold and a voltage level of the output signal satisfying an output voltage threshold, toggling activation of a second driver of the plurality of drivers, wherein the second driver is configured to switch more current when activated than the first driver, and wherein the first driver has a faster slew rate than the second driver.

2. The method of claim 1, further comprising:
determining that the voltage level of the output signal satisfies the output voltage threshold where the voltage level of the output signal is greater than the output voltage threshold, and
wherein toggling activation of the second driver of the plurality of drivers comprises activating the second driver.

3. The method of claim 2, wherein the output voltage threshold is a first output voltage threshold, the method further comprising:
in response to the voltage level of the input signal satisfying the input voltage threshold and that the voltage level of the output signal being less than a second output voltage threshold, activating the second driver; and
responsive to the voltage level of the output signal being between the first output voltage threshold and the second output voltage threshold, deactivating the second driver.

4. The method of claim 1, wherein the first driver includes a resistance configured to modify the slew rate of the first driver.

5. The method of claim 1, wherein:
activating the first driver comprises activating a first push driver of the plurality of drivers, and
toggling activation of the second driver comprises toggling activation of a second push driver of the plurality of drivers, or
activating the first driver comprises activating a first pull driver of the plurality of drivers, and toggling activation of the second driver comprises toggling activation of a second pull driver of the plurality of drivers.

6. The method of claim 1, wherein the output signal is a communications signal of a controller area network (CAN) bus.

7. An output driver comprising:
a plurality of drivers configured to collectively generate an output signal, wherein:
a first driver of the plurality of drivers is configured to activate responsive to a voltage level of an input signal satisfying an input voltage threshold,
a second driver of the plurality of drivers is configured to toggle activation responsive to the voltage level of the input signal satisfying the input voltage threshold and a voltage level of the output signal satisfying an output voltage threshold,
wherein the second driver is configured to switch more current when activated than the first driver, and
wherein the first driver has a faster slew rate than the second driver.

8. The output driver of claim 7, wherein:
the voltage level of the output signal satisfies the output voltage threshold where the voltage level of the output signal is greater than the output voltage threshold, and
the second driver is configured to toggle activation by at least activating.

9. The output driver of claim 8, wherein:
the output voltage threshold is a first output voltage threshold,
the second driver is configured to activate responsive to the voltage level of the input signal satisfying the input voltage threshold and that the voltage level of the output signal being less than a second output voltage threshold, and
the second driver is configured to deactivate responsive to the voltage level of the output signal being between the first output voltage threshold and the second output voltage threshold.

10. The output driver of claim 7, further comprising:
a resistance configured to modify the slew rate of the first driver.

11. The output driver of claim 7, wherein:
the first driver is configured to activate by at least activating a first push driver of the plurality of drivers, and
the second driver is configured to toggle activation by at least toggling activation of a second push driver of the plurality of drivers, or
the first driver is configured to activate by at least activating a first pull driver of the plurality of drivers, and
the second driver is configured to toggle activation by at least toggling activation of a second pull driver of the plurality of drivers.

12. The output driver of claim 8, wherein the output signal is a communications signal of a controller area network (CAN) bus.

13. An output driver comprising:
a plurality of means for collectively generating an output signal; and
means for controlling the means for collectively generating the output signal configured to:
activate a first means of the plurality of means for collectively generating the output signal responsive to a voltage level of an input signal satisfying an input voltage threshold,
toggle activation of a second means of the plurality of means for collectively generating the output signal responsive to the voltage level of the input signal satisfying the input voltage threshold and a voltage level of the output signal satisfying an output voltage threshold,
wherein the second means is configured to switch more current when activated than the first means, and
wherein the first means has a faster slew rate than the second means.

14. The output driver of claim 13, wherein the means for controlling are configured to:
determine that the voltage level of the output signal satisfies the output voltage threshold where the voltage level of the output signal is greater than the output voltage threshold, and
toggle activation of the second means of the plurality of drivers by at least activating the second means.

15. The output driver of claim 14, wherein the output voltage threshold is a first output voltage threshold, and wherein the means for controlling are configured to:
activate the second means responsive to the voltage level of the input signal satisfying the input voltage threshold and that the voltage level of the output signal being less than a second output voltage threshold, and
deactivate the second means responsive to the voltage level of the output signal being between the first output voltage threshold and the second output voltage threshold.

16. The output driver of claim 13, further comprising:
means for modifying the slew rate of the first driver.

17. The output driver of claim 13, wherein the means for controlling are configured to:
activate the first means by at least activating a first push means of the plurality of means, and
toggling activation of the second means by at least toggling activation of a second push means of the plurality of means, or
activating the first means by at least activating a first pull means of the plurality of means, and
toggling activation of the second means by at least toggling activation of a second pull means of the plurality of means.

18. The output driver of claim 13, wherein the output signal is a communications signal of a controller area network (CAN) bus.

* * * * *